(12) United States Patent
Reddy et al.

(10) Patent No.: US 12,535,744 B2
(45) Date of Patent: Jan. 27, 2026

(54) OVERLAY ESTIMATION BASED ON OPTICAL INSPECTION AND MACHINE LEARNING

(71) Applicant: KLA Corporation, Milpitas, CA (US)

(72) Inventors: Nireekshan K. Reddy, Tel Aviv (IL); Arvind Jayaraman, New Hudson, MI (US); Stilian Ivanov Pandev, Santa Clara, CA (US); Amnon Manassen, Haifa (IL); Boaz Ophir, Haifa (IL); Udi Shusterman, Ramat Rachel (IL); Nadav Gutman, Zichron Ya'aqov (IL)

(73) Assignee: KLA Corporation, Milpitas, CA (US)

( * ) Notice: Subject to any disclaimer, the term of this patent is extended or adjusted under 35 U.S.C. 154(b) by 126 days.

(21) Appl. No.: 18/335,628

(22) Filed: Jun. 15, 2023

(65) Prior Publication Data
US 2024/0142883 A1 May 2, 2024

Related U.S. Application Data

(60) Provisional application No. 63/420,683, filed on Oct. 31, 2022.

(51) Int. Cl.
*G03F 7/00* (2006.01)
(52) U.S. Cl.
CPC .... *G03F 7/70633* (2013.01); *G03F 7/706841* (2023.05)
(58) Field of Classification Search
CPC ........... G03F 7/70633; G03F 7/706841; G03F 7/706847
See application file for complete search history.

(56) References Cited

U.S. PATENT DOCUMENTS

| | | | |
|---|---|---|---|
| 5,608,526 A | 3/1997 | Piwonka-Corle et al. | |
| 5,859,424 A | 1/1999 | Norton et al. | |
| 6,429,943 B1 | 8/2002 | Opsal et al. | |
| 7,478,019 B2 | 1/2009 | Zangooie et al. | |
| 7,873,585 B2 * | 1/2011 | Izikson ............... | G03F 7/70625 706/21 |
| 7,929,667 B1 | 4/2011 | Zhuang et al. | |
| 7,933,026 B2 | 4/2011 | Opsal et al. | |
| 8,559,001 B2 | 10/2013 | Chang et al. | |

(Continued)

FOREIGN PATENT DOCUMENTS

| | | |
|---|---|---|
| EP | 3693795 A1 | 8/2020 |
| WO | 2016086138 A1 | 6/2016 |

(Continued)

OTHER PUBLICATIONS

PCT/US2023/035459, International Search Report, Feb. 20, 2024.

(Continued)

*Primary Examiner* — Gordon J Stock, Jr.
(74) *Attorney, Agent, or Firm* — Huse IP Law

(57) ABSTRACT

One or more optical images of a portion of a semiconductor wafer are obtained. The one or more optical images show a first structure in a first process layer and a second structure in a second process layer. The one or more optical images are provided to a machine-learning model trained to estimate an overlay offset between the first structure and the second structure. An estimated overlay offset between the first structure and the second structure is obtained from the machine-learning model.

16 Claims, 5 Drawing Sheets

(56) References Cited

U.S. PATENT DOCUMENTS

| | | | |
|---|---|---|---|
| 8,611,639 B2 | 12/2013 | Kulkarni et al. | |
| 9,291,554 B2 | 3/2016 | Kuznetsov et al. | |
| 9,885,962 B2 | 2/2018 | Veldman et al. | |
| 9,915,522 B1 | 3/2018 | Jiang et al. | |
| 9,971,251 B2 * | 5/2018 | Schmitt-Weaver | G03F 7/70633 |
| 10,013,518 B2 | 7/2018 | Bakeman et al. | |
| 10,101,670 B2 | 10/2018 | Pandev et al. | |
| 10,324,050 B2 | 6/2019 | Hench et al. | |
| 10,352,695 B2 | 7/2019 | Dziura et al. | |
| 10,473,460 B2 * | 11/2019 | Gutman | H01J 37/28 |
| 10,622,238 B2 * | 4/2020 | Gutman | H01L 21/681 |
| 11,067,389 B2 * | 7/2021 | Chuang | G01B 11/272 |
| 11,248,905 B2 * | 2/2022 | Amit | G06N 99/00 |
| 12,181,271 B2 * | 12/2024 | Moon | G01B 11/24 |
| 2014/0172394 A1 | 6/2014 | Kuznetsov et al. | |
| 2015/0046121 A1 | 2/2015 | Dziura et al. | |
| 2015/0323316 A1 * | 11/2015 | Shchegrov | G01B 11/27 702/150 |
| 2016/0117812 A1 * | 4/2016 | Pandev | G06F 18/214 382/149 |
| 2016/0117847 A1 * | 4/2016 | Pandev | G06T 7/33 348/87 |
| 2017/0194126 A1 * | 7/2017 | Bhaskar | G06T 7/0004 |
| 2018/0106735 A1 | 4/2018 | Gellineau et al. | |
| 2018/0252514 A1 * | 9/2018 | Pandev | G03F 7/705 |
| 2019/0017946 A1 | 1/2019 | Wack et al. | |
| 2019/0325571 A1 * | 10/2019 | Pandev | G03F 7/70625 |
| 2019/0378012 A1 * | 12/2019 | Tripodi | G03F 7/70616 |
| 2021/0035282 A1 | 2/2021 | Plihal et al. | |
| 2021/0142466 A1 * | 5/2021 | Ophir | G01B 11/272 |
| 2021/0207956 A1 | 7/2021 | Shchegrov et al. | |
| 2021/0407073 A1 | 12/2021 | Yati | |
| 2022/0269184 A1 | 8/2022 | Lin et al. | |
| 2022/0291590 A1 * | 9/2022 | Su | G03F 7/70508 |
| 2022/0291593 A1 * | 9/2022 | Werkman | G03F 1/42 |
| 2023/0004096 A1 * | 1/2023 | Middlebrooks | G06N 3/047 |
| 2023/0040124 A1 * | 2/2023 | Nienhuys | G03F 7/70625 |
| 2023/0196189 A1 * | 6/2023 | Freytag | G03F 7/70616 706/12 |
| 2024/0111221 A1 * | 4/2024 | Van Laarhoven | G03F 7/706841 |
| 2024/0184219 A1 * | 6/2024 | Bottegal | G03F 7/706839 |
| 2025/0060679 A1 * | 2/2025 | Barbieri | G06N 3/096 |

FOREIGN PATENT DOCUMENTS

| | | | | |
|---|---|---|---|---|
| WO | WO-2020200993 A1 * | 10/2020 | | G06N 3/045 |
| WO | WO-2021038815 A1 * | 3/2021 | | G06T 7/0004 |
| WO | 2021262778 A1 | 12/2021 | | |
| WO | WO-2022072162 A1 * | 4/2022 | | G06F 18/40 |

OTHER PUBLICATIONS

PCT/US2023/035459, Written Opinion of the International Searching Authority, Feb. 20, 2024.

P. Lemaillet et al., "Intercomparison between optical and x-ray scatterometry measurements of FinFET structures," Proc. SPIE 8681, Metrology, Inspection, and Process Control for Microlithography XXVII, 86810Q (Apr. 10, 2013).

R.J. Kline et al., "X-ray scattering critical dimensional metrology using a compact x-ray source for next generation semiconductor devices," J. Micro/Nanolith. MEMS MOEMS 16(1) 014001 (Feb. 8, 2017).

* cited by examiner

OVERLAY ESTIMATION BASED ON OPTICAL INSPECTION AND MACHINE LEARNING

RELATED APPLICATION

This application claims priority to U.S. Provisional Patent Application No. 63/420,683, filed on Oct. 31, 2022, which is incorporated by reference in its entirety for all purposes.

TECHNICAL FIELD

This disclosure relates to measuring overlay (i.e., overlay offsets) for semiconductor devices, and more specifically to measuring overlay offsets using optical inspection and machine learning.

BACKGROUND

In semiconductor fabrication, misalignment between process layers causes unwanted shifts in the positions of structures in one process layer as compared to the positions of structures in another process layer. Such a shift (i.e., displacement) is referred to as overlay, or equivalently, as an overlay offset. Measuring these shifts is referred to as overlay metrology. Accurate overlay metrology is important for measuring process drift and thus for establishing and maintaining process control, especially during the ramp-up period for a new semiconductor process and/or device. Accurate overlay metrology becomes increasingly important as feature sizes (e.g., line widths) on semiconductor wafers shrink, because the reduction in feature sizes reduces the available overlay budget accordingly: less overlay error can be accommodated as features shrink.

Scanning electron microscopes (SEMs) are useful tools for overlay metrology because they have high resolution and can image a structure regardless of its shape or size. Scanning electron microscopy is slow, however, and thus has low throughput. Accordingly, it is desirable to use optical inspection for overlay metrology. But optical inspection does not provide the accuracy that SEMs provide for overlay metrology. For example, optical inspection may be unable to resolve the structures used in overlay metrology, because the size of the structures is below the diffraction limit. Overlay thus cannot typically be measured simply by looking at images generated by optical inspection, or by applying object-recognition algorithms to such images. Optical images still contain information about overlay encoded within them, however, and algorithms exist to extract this information from the images. But the accuracy of measurements taken using these classical algorithms is limited.

SUMMARY

To improve the accuracy of overlay metrology based on optical inspection, machine-learning is used to analyze optical images of semiconductor structures.

In some embodiments, a method includes obtaining one or more optical images of a portion of a semiconductor wafer showing a first structure in a first process layer and a second structure in a second process layer. The one or more optical images are provided to a machine-learning model trained to estimate an overlay offset between the first structure and the second structure. An estimated overlay offset between the first structure and the second structure is obtained from the machine-learning model.

In some embodiments, a non-transitory computer-readable storage medium stores one or more programs for execution by one or more processors. The one or more programs include instructions for performing the above method.

In some embodiments, a system includes one or more optical inspection tools to optically inspect semiconductor wafers, one or more processors, and memory storing one or more programs for execution by the one or more processors. The one or more programs include instructions for performing the above method, with the one or more optical images being obtained from the one or more optical inspection tools.

BRIEF DESCRIPTION OF THE DRAWINGS

For a better understanding of the various described implementations, reference should be made to the Detailed Description below, in conjunction with the following drawings.

Like reference numerals refer to corresponding parts throughout the drawings and specification.

DETAILED DESCRIPTION

Reference will now be made in detail to various embodiments, examples of which are illustrated in the accompanying drawings. In the following detailed description, numerous specific details are set forth in order to provide a thorough understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

Figure 1:
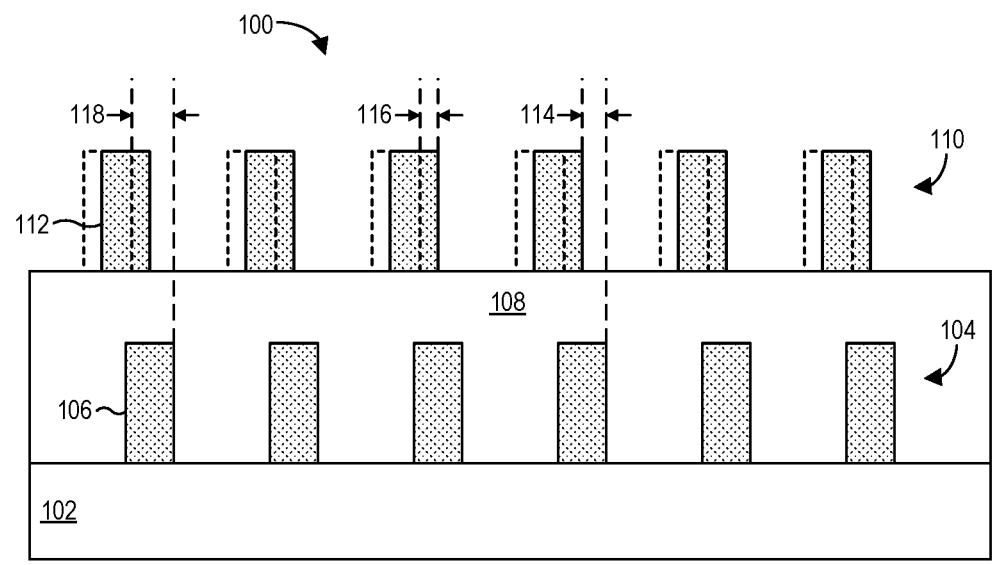
FIG. 1 is a cross-sectional side view of a portion of a semiconductor wafer that is to be subjected to optical imaging to perform overlay metrology and that includes a first structure in a first process layer and a second structure in a second process layer, in accordance with some embodiments.

FIG. 1 is a cross-sectional side view of a portion 100 of a semiconductor wafer to be subjected to optical imaging to perform overlay metrology, in accordance with some embodiments. The semiconductor wafer may be fully or partially processed. The portion 100 includes a first structure 104 in a first process layer and a second structure 110 in a second process layer. In the example of FIG. 1, the first structure 104 is a first grating that includes a plurality of grating elements 106, and the second structure 110 is a second grating that includes a plurality of grating elements 112. The plurality of grating elements 106 may be arranged periodically in the first structure 104, with successive grating elements 106 being separated by the same distance and thus having the same pitch. Similarly, the plurality of grating elements 112 may be arranged periodically in the second structure 110, with successive grating elements 112 being separated by the same distance and thus having the same pitch. The pitch of the grating elements 112 in the second structure 110 may be the same as the pitch of the grating elements 106 in the first structure 104.

The first process layer, in which the first structure 104 is situated, is on a substrate 102 of the semiconductor wafer. Alternatively, the first process layer may be above other process layers. The grating elements 106 of the first structure 104 are separated from each other by a fill material (e.g., a dielectric). The grating elements 112 of the second structure 110 may be separated from each other by a fill material (e.g., a dielectric) or by air, depending on how far processing of the semiconductor wafer has proceeded. A fill layer 108 (e.g., an inter-layer dielectric) separates the second process layer from the first process layer. In some embodiments, the grating elements 106 and/or the grating elements 112 are metal lines. In the nomenclature of overlay metrology, the second process layer, which is above the first process layer, is referred to as the "outer layer" and the first process layer, which is below the second process layer, is referred to as the "inner layer."

FIG. 1 shows both intended and actual positioning of the grating elements 112 in the second structure 110 with respect to the grating elements 106 of the first structure 104. The intended positioning is shown with solid lines and a fill pattern, while the actual positioning is shown with dashed lines. There is an intended (i.e., programmed) overlay offset 114 between the second structure 110 and the first structure 104. The intended overlay offset 114 is the overlay offset that would exist if the grating elements 112 in the second structure 110 were fabricated exactly where they were intended to be fabricated with respect to the grating elements 106 in the first structure 104. In the example of FIG. 1, the intended overlay offset 114 is non-zero. Alternatively, the intended overlay offset may be zero.

In practice, due to imprecision and variability in photolithographic processing, neither the grating elements 112 in the second structure 110 nor the grating elements 106 in the first structure 104 can generally be fabricated exactly where intended. The difference between the actual and intended relative positions is an additional, unintended (i.e., erroneous) overlay offset 116, which may be positive or negative. A total overlay offset 118 equals the sum of the intended overlay offset 114 and the unintended overlay offset 116.

The portion 100 may be a test pattern on the semiconductor wafer. The test pattern may be separate from the dies on the semiconductor wafer (e.g., may be in a scribe line) or may be within a die on the semiconductor wafer. The semiconductor wafer may have multiple test patterns like the portion 100 at various locations, such that overlay metrology may be performed at multiple location on the wafer. Alternatively, the portion 100 may be part of the circuitry of the die itself.

Figure 2:
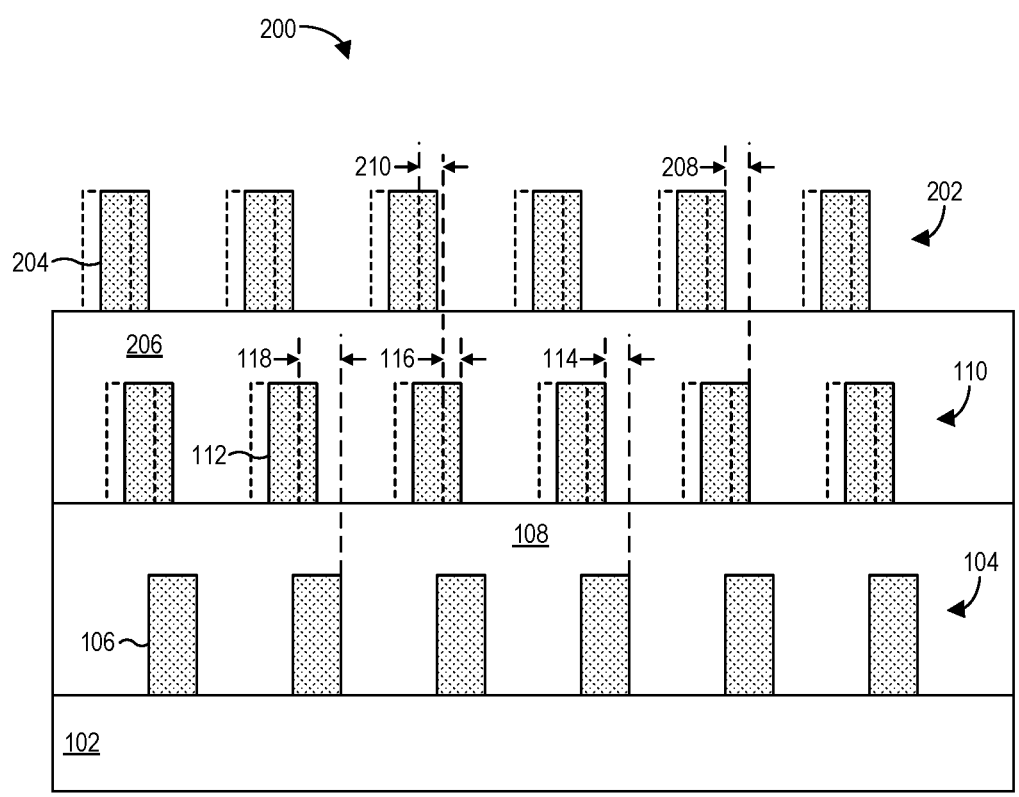
FIG. 2 is a cross-sectional side view of a portion of a semiconductor wafer that is to be subjected to optical imaging to perform overlay metrology and that includes a first structure in a first process layer, a second structure in a second process layer, and a third structure in a third process layer, in accordance with some embodiments.

FIG. 2 is a cross-sectional side view of a portion 200 of a semiconductor wafer to be subjected to optical imaging to perform overlay metrology, in accordance with some embodiments. The semiconductor wafer may be fully or partially processed. The portion 200 includes the first structure 104 in the first process layer, the second structure 110 in the second process layer, and a third structure 202 in a third process layer. In the example of FIG. 2, the third structure 202 is a third grating that includes a plurality of grating elements 204. The plurality of grating elements 204 may be arranged periodically in the third structure 202, with successive grating elements 204 being separated by the same distance and thus having the same pitch, which is the same pitch as the pitch of the grating elements 106 in the first structure 104 and the pitch of the grating elements 112 in the second structure 110.

The grating elements 204 of the third structure 202 may be separated from each other by a fill material (e.g., a dielectric) or by air, depending on how far processing of the semiconductor wafer has proceeded. The grating elements 112 of the second structure 110 in the portion 200 are separated from each other by a fill material (e.g., a dielectric). A fill layer 206 (e.g., an inter-layer dielectric) separates the third process layer from the second process layer. In some embodiments, the grating elements 204 are metal lines (e.g., as are the grating elements 106 and/or the grating elements 112).

In addition to showing both intended and actual positioning of the grating elements 112 in the second structure 110, FIG. 2 shows both intended and actual positioning of the grating elements 204 in the third structure 202. The intended positioning is shown with solid lines and a fill pattern, while the actual positioning is shown with dashed lines. There is an intended (i.e., programmed) overlay offset 208 between the third structure 202 and the second structure 110. The intended overlay offset 208 is the overlay offset that would exist if the grating elements 204 in the third structure 202 were fabricated exactly where they were intended to be fabricated with respect to the grating elements 112 in the second structure 110. In the example of FIG. 1, the intended overlay offset 208 is non-zero. Alternatively, the intended overlay offset may be zero. But because neither the grating elements 204 in the third structure 202 nor the grating elements 112 in the second structure 110 can generally be fabricated exactly where intended, an actual (i.e., total) overlay offset 210 exists that is different from the intended overlay offset 208. The difference between the total overlay offset 210 and the intended overlay offset 208 is an unintended (i.e., erroneous) overlay offset, which may be positive or negative.

When using the portion 200 to perform overlay metrology between the third structure 202 and the second structure 110, the third process layer is the outer layer and the second process layer is the inner layer, with the third process layer being above the second process layer. When using the portion 200 to perform overlay metrology between the second structure 110 and the first structure 104, the second process layer is the outer layer and the first process layer is the inner layer. The portion 200 may also be used to perform overlay metrology between the third structure 202 and the first structure 104, with the third process layer being the outer layer and the first process layer being the inner layer.

The portion 200 may be a test pattern on the semiconductor wafer, as described for the portion 100 (FIG. 1), or may be part of the circuitry of the die itself.

Figure 3:
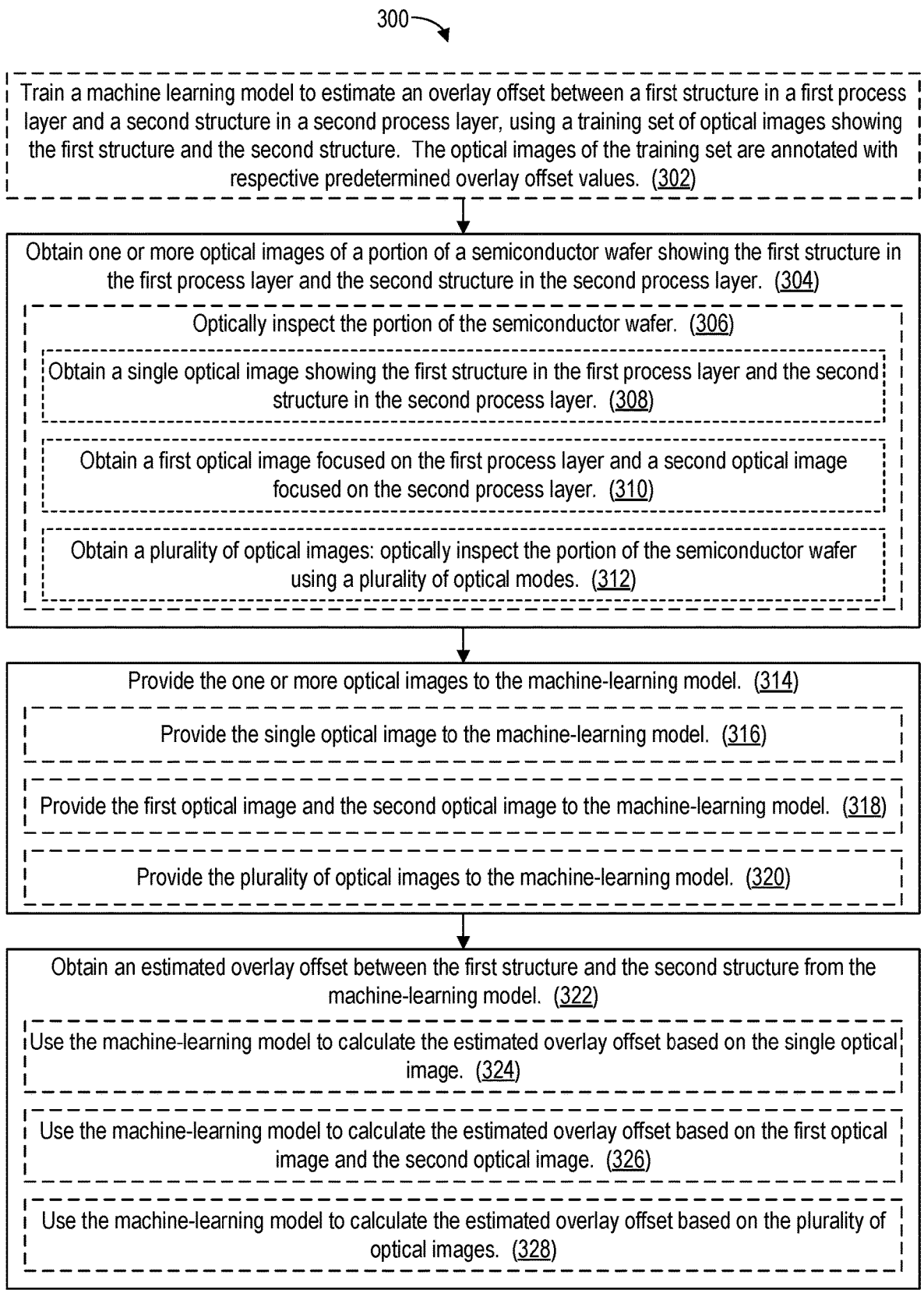
FIG. 3 is a flowchart showing a method of measuring an overlay offset using machine learning, in accordance with some embodiments.

FIG. 3 is a flowchart showing a method 300 of measuring an overlay offset using machine learning, in accordance with some embodiments. The method 300 may be performed by one or more computer systems (e.g., the computer system of the semiconductor inspection system 600, FIG. 6).

In some embodiments, the method 300 includes training (302) a machine learning model to estimate an overlay offset between a first structure in a first process layer and a second structure in a second process layer, using a training set of optical images showing the first structure and the second structure. For example, the first structure is the first structure 104 (FIG. 1) and the second structure is the second structure 110 (FIG. 1). In other examples, the first structure and the second structure are respective components of another periodic grating or of an aperiodic grating, either of which may be a test pattern on semiconductor wafers (e.g., as implemented in scribe lines). In yet other examples, the first structure and the second structure are respective components of a different test pattern (e.g., box-in-box), which may be implemented in scribe lines. In still other examples, the first structure and the second structure are respective components of circuitry on semiconductor die as wholly or partially fabricated on semiconductor wafers.

The optical images of the training set are annotated with respective predetermined overlay offset values (e.g., total overlay offset values and/or unintentional overlay offset values): the predetermined overlay offset values are stored in association with their respective optical images. The respective predetermined overlay offset values for the optical images of the training set have been previously measured using, for example, scanning electron microscopy: the portions of semiconductor wafers that were optically inspected to generate the optical images in the training set are also inspected using a scanning electron microscope (SEM) (e.g., SEM 634, FIG. 6), or using multiple SEMs, and the overlay offset values are measured from the resulting SEM images. These predetermined overlay offset values serve as ground truth for the training 302. Examples of the machine-learning model include, without limitation, a neural-network model, a gradient-boosting model, a support vector machine, and a principal-component-regression model.

To perform the training 302, the training set of optical images is obtained along with the associated predetermined overlay offset values. The machine-learning model is initialized (e.g., in a manner involving randomization). Optical images of the training set are provided as input to the machine-learning model, and the resulting output of the machine-learning model is compared to the predetermined overlay offset values for respective images, which are the expected output. The optical images of the training set may be provided directly to the machine-learning model, or feature extraction may be performed and the extracted features (e.g., in the form of feature vectors for respective optical images) provided to the machine-learning model. The machine-learning model is adjusted based on differences between the resulting output (i.e., the actual output) and the expected output, and the training process continues until the resulting output converges with the expected output. Once this convergence occurs, the machine-learning model may be tested and then deployed for use in semiconductor manufacturing. The machine-learning model may be deployed to one or more semiconductor fabrication facilities, referred to as fabs, or to a computer system communicatively coupled with one or more fabs.

Alternatively, training the machine-learning model is omitted from the method 300. For example, the method 300 is performed using a machine-learning model that has already been trained to estimate overlay offsets between the first structure and the second structure and has been deployed for use in semiconductor manufacturing. Again, the first structure and the second structure may respectively be the first structure 104 (FIG. 1) and the second structure 110 (FIG. 1); may be respective components of another periodic grating or of an aperiodic grating, either of which may be a test pattern on semiconductor wafers (e.g., as implemented in scribe lines); may be respective components of a different test pattern (e.g., box-in-box), which may be implemented in scribe lines; or may be respective components of circuitry on semiconductor die as wholly or partially fabricated on semiconductor wafers.

One or more optical images of a portion of a semiconductor wafer are obtained (304) showing the first structure in the first process layer and the second structure in the second process layer (i.e., showing a particular instance of the first and second structures at a particular location in a particular semiconductor die). The one or more optical images are different from the training set of optical images. For example, none of the one or more optical images were included in the training set. The instance of the first and second structures in the one or more optical images thus may be different (e.g., may be at a different location, on a different semiconductor die, and/or on a different semiconductor wafer) from the instances of the first and second structures in respective optical images of the training set. In some embodiments, obtaining the one or more optical images includes optically inspecting (306) the portion of the semiconductor wafer (e.g., using an optical inspection tool 632, FIG. 6). Alternatively, the one or more optical images are obtained from a computer memory (e.g., database) storing optical images previously generated by optical inspection.

The one or more optical images are provided (314) to the machine-learning model (e.g., a neural-network model, gradient-boosting model, support vector machine, or principal-component-regression model). In some embodiments, the one or more optical images are provided to the machine-learning model directly (e.g., in accordance with deep learning), such that the machine-learning model receives the one or more optical images as input. Alternatively, the one or more optical images are provided to the machine-learning model indirectly. For example, feature extraction is performed on the one or more images, and the extracted features (e.g., in the form of a feature vector) are provided as input to the machine-learning model.

An estimated overlay offset between the first structure and the second structure (e.g., for the particular instance of the first and second structures) is obtained (322) from the machine-learning model: the machine-learning model determines (i.e., calculates) the estimated overlay offset using the one or more optical images and provides the estimated overlay offset as output. The estimated overlay offset may be an estimated total overlay offset (e.g., total overlay offset 118, FIG. 1) or an estimated unintended overlay offset (e.g., unintended overlay offset 116, FIG. 1). The estimated overlay offset may be received from the machine-learning model in response to providing the one or more optical images to the machine-learning model. The machine-learning model may determine the estimated overlay offset based only on the one or more optical images, or based on the one or more optical images and based further on additional data (e.g., metadata for the one or more optical images and/or additional metrology data for the first and second structures).

In some embodiments, the one or more optical images are a single optical image showing the first structure in the first process layer and the second structure in the second process layer. The single optical image is obtained (308) and provided (316) to the machine-learning model, directly or indirectly. The machine-learning model is used to calculate (324) the estimated overlay offset based on the single optical image.

In some other embodiments, the one or more optical images include a first optical image focused on the first process layer and a second optical image focused on the second process layer. The first and second optical images are obtained (310) and provided (318) to the machine-learning model, directly or indirectly. The first and second optical images may be obtained, for example, using respective first and second cameras in an optical inspection system, with the first and second cameras having a known alignment. A stitching process may be performed on the first and second images to align them in accordance with the known alignment. The machine-learning model is used to calculate (326) the estimated overlay offset based on the first optical image and the second optical image.

In some embodiments, the one or more optical images include a plurality of optical images obtained (312) by optically inspect the portion of the semiconductor wafer using a plurality of optical modes. Each optical mode of the plurality of optical modes has a distinct set of optical conditions for inspecting the portion of the semiconductor wafer, with one or more the optical conditions in the set being different from the other sets of optical conditions for the plurality of optical modes. Examples of optical conditions include, without limitation, the light source, range of wavelengths, polarization, focus, transmission distribution in the illumination aperture, transmission distribution in the collection aperture, and phase-shift distribution in the collection aperture. Respective optical modes may also or alternatively correspond to respective Mueller elements from an imaging Mueller ellipsometer and/or respective harmonics signals from an imaging ellipsometer. Each optical image of the plurality of optical images is obtained using a respective optical mode of the plurality of optical modes. Each optical mode may be used to generate a single optical image showing both the first and second structures or to generate multiple optical images (e.g., a first image focused on the first process layer and a second image focused on the second process layer). The plurality of optical images is provided (320) to the machine-learning model, directly or indirectly. The machine-learning model is used to calculate (328) the estimated overlay offset based on the plurality of optical images.

The estimated overlay offset obtained in the method 300 may be used directly for monitoring and controlling a semiconductor fabrication process (e.g., for statistical process control). Alternatively, the estimated overlay offset may be one of multiple inputs subsequently used to determine an overlay offset between the first and second structures. For example, the estimated overlay offset may be averaged or otherwise combined with one or more other overlay-offset values calculated for the first and second structures using different techniques (e.g., techniques not involving machine learning).

The method 300 may be extended to determine an overlay offset between the second structure (e.g., the second structure 110, FIG. 2) and a third structure in a third process layer (e.g., the third structure 202, FIG. 2). For example, the one or more optical images further show the third structure in the third process layer (i.e., show a particular instance of the third structure). The machine-learning model is a first machine-learning model and the method 300 further includes a second machine-learning model (e.g., a neural-network model, gradient-boosting model, support vector machine, or principal-component-regression model) trained to estimate an overlay offset between the second structure and the third structure. The second machine-learning model may be trained as part of the method 300, by analogy to the training 302, or may have been previously trained and deployed for use in semiconductor manufacturing. The one or more optical images are provided, directly or indirectly, to the first machine-learning model, per step 314, and to the second machine-learning model. In an example, the one or more optical images are a single optical image showing the first structure, the second structure, and the third structure. The single optical image is provided to the first machine-learning model, per step 316, and also to the second machine-learning model. In another example, the one or more optical images include a first optical image focused on the first process layer, a second optical image focused on the second process layer, and a third optical image focused on the third process layer. The first and second optical images are provided to the first machine-learning model, per step 318, and the second and third optical images are provided to the second machine-learning model. Other examples are possible. An estimated overlay offset between the second structure and the third structure (e.g., for the particular instance of the second and third structures) is obtained from the second machine-learning model: the second machine-learning model is used to calculate the estimated overlay offset between the second structure and the third structure. The estimated overlay offset may be a total overlay offset (e.g., total overlay offset 210, FIG. 2) or an unintended overlay offset (e.g., the difference between the total overlay offset 210 and the intended overlay offset 208, FIG. 2).

In addition to or instead of using the second machine-learning model to obtain the estimated overlay offset between the second structure and the third structure, a third machine-learning model (e.g., a neural-network model, gradient-boosting model, support vector machine, or principal-component-regression model) may be used to obtain an estimated overlay offset between the first structure (e.g., the first structure 104, FIG. 2) and the third structure (e.g., the third structure 202, FIG. 2). The third machine-learning model may be trained as part of the method 300, by analogy to the training 302, or may have been previously trained and deployed for use in semiconductor manufacturing. The one or more optical images are provided, directly or indirectly, to the first machine-learning model, per step 314, and to the third machine-learning model (and also to the second machine-learning model, in accordance with some embodiments). In an example, the one or more optical images are a single optical image showing the first structure, the second structure, and the third structure. The single optical image is provided to the first machine-learning model, per step 316, as well as to the third machine-learning model (and also to the second machine-learning model, in accordance with some embodiments). In another example, the one or more optical images include a first optical image focused on the first process layer, a second optical image focused on the second process layer, and a third optical image focused on the third process layer. The first and second optical images are provided to the first machine-learning model, per step 318, and the first and third optical images are provided to the third machine-learning model (and the second and third optical images are provided to the second machine-learning model, in accordance with some embodiments). The estimated overlay offset between the first structure and the third structure (e.g., for the particular instance of the first and third structures) is obtained from the third machine-learning model: the third machine-learning model is used to calculate the estimated overlay offset between the first structure and the third structure. The estimated overlay offset may be a total overlay offset or an unintended overlay offset.

The first, second, and/or third machine-learning models may be combined into a single machine-learning model with multiple outputs. The single machine-learning model is trained to estimate offset overlays between the first and second structures, between the second and third structures, and/or between the first and third structures. The multiple outputs include a first output to provide the estimated offset overlay between the first and second structures, a second output to provide the estimated offset overlay between the second and third structures, and a third output to provide the estimated offset overlay between the first and third structures.

The first, second, and third structures may respectively be the first structure 104 (FIG. 2), the second structure 110 (FIG. 2), and the third structure 202 (FIG. 2); may be respective components of another periodic grating or of an aperiodic grating, either of which may be a test pattern on semiconductor wafers (e.g., as implemented in scribe lines); may be respective components of a different test pattern (e.g., box-in-box), which may be implemented in scribe lines; or may be respective components of circuitry on semiconductor die as wholly or partially fabricated on semiconductor wafers.

Figure 4:
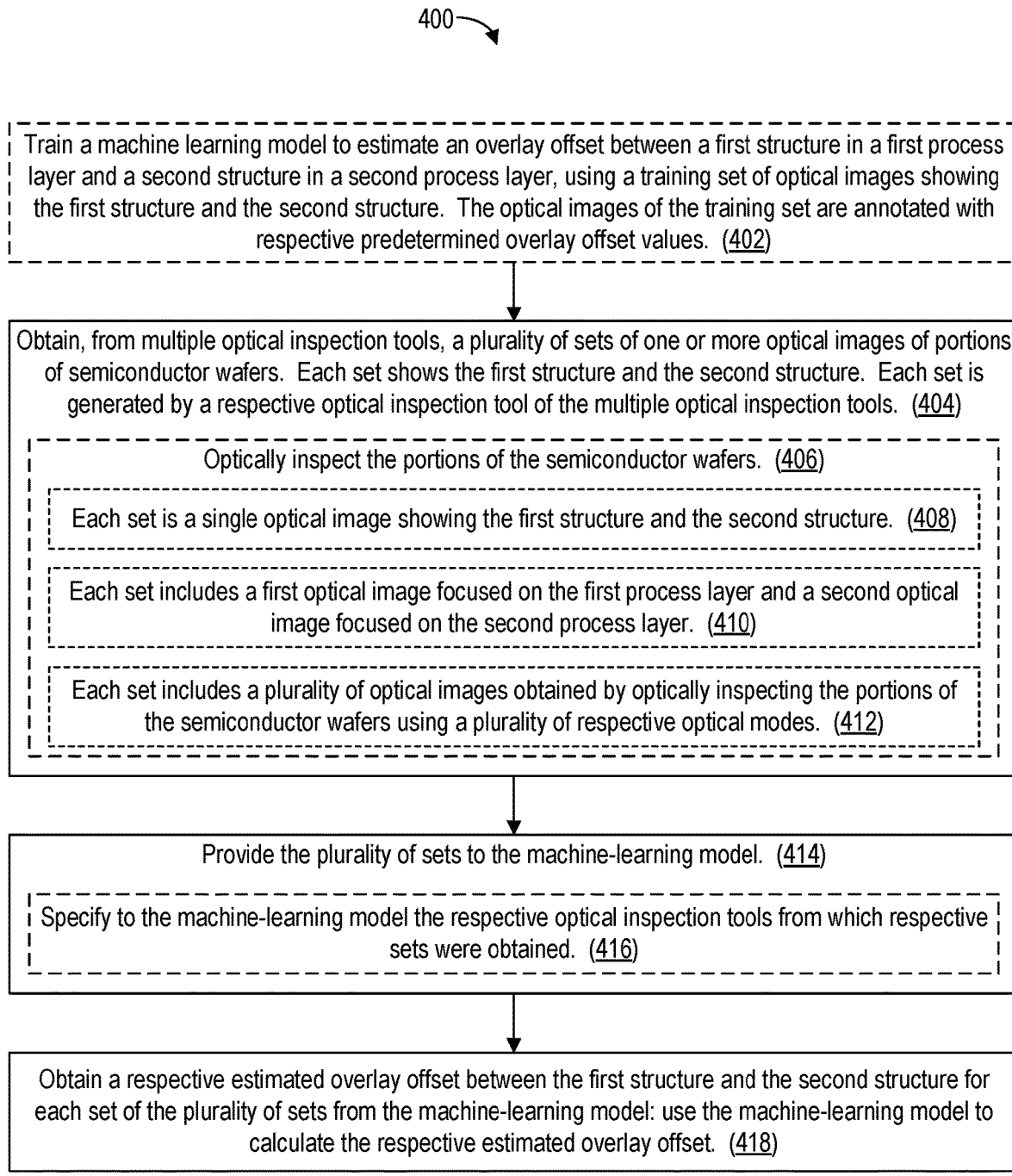
FIG. 4 is a flowchart showing a method of measuring overlay offsets for optical images from multiple optical inspection tools using machine learning, in accordance with some embodiments.

FIG. 4 is a flowchart showing a method 400 of measuring overlay offsets for optical images from multiple optical inspection tools, in accordance with some embodiments. The method 400 may be performed by one or more computer systems (e.g., the computer system of the semiconductor inspection system 600, FIG. 6). The method 400 may include the method 300 (FIG. 3), which may be performed as part of the method 400.

In some embodiments, a machine learning model is trained (402) to estimate an overlay offset between a first structure in a first process layer (e.g., the first structure of the method 300, FIG. 3) and a second structure in a second process layer (e.g., the second structure of the method 300, FIG. 3), using a training set of optical images showing the first structure and the second structure. The optical images of the training set are annotated with respective predetermined overlay offset values (e.g., total overlay offset values and/or unintentional overlay offset values): the predetermined overlay offset values are stored in association with their respective optical images. The respective predetermined overlay offset values for the optical images of the training set are measured, for example, using scanning electron microscopy (e.g., as described for the training 302 in the method 300, FIG. 3). Examples of the machine-learning model include, without limitation, a neural-network model, a gradient-boosting model, a support vector machine, and a principal-component-regression model. The training set of optical images may be obtained from a plurality of optical inspection tools: respective optical inspection tools of the plurality of optical inspection tools may generate respective optical images of the training set by optically inspecting respective semiconductor wafers. The training 402 may be performed as described for the training 302 in the method 300 (FIG. 3).

Alternatively, training the machine-learning model is omitted from the method 400. For example, the method 400 is performed using a machine-learning model that has already been trained to estimate overlay offsets between the first structure and the second structure (e.g., the first and second structures of the method 300, FIG. 3) and has been deployed for use in semiconductor manufacturing.

Figure 6:
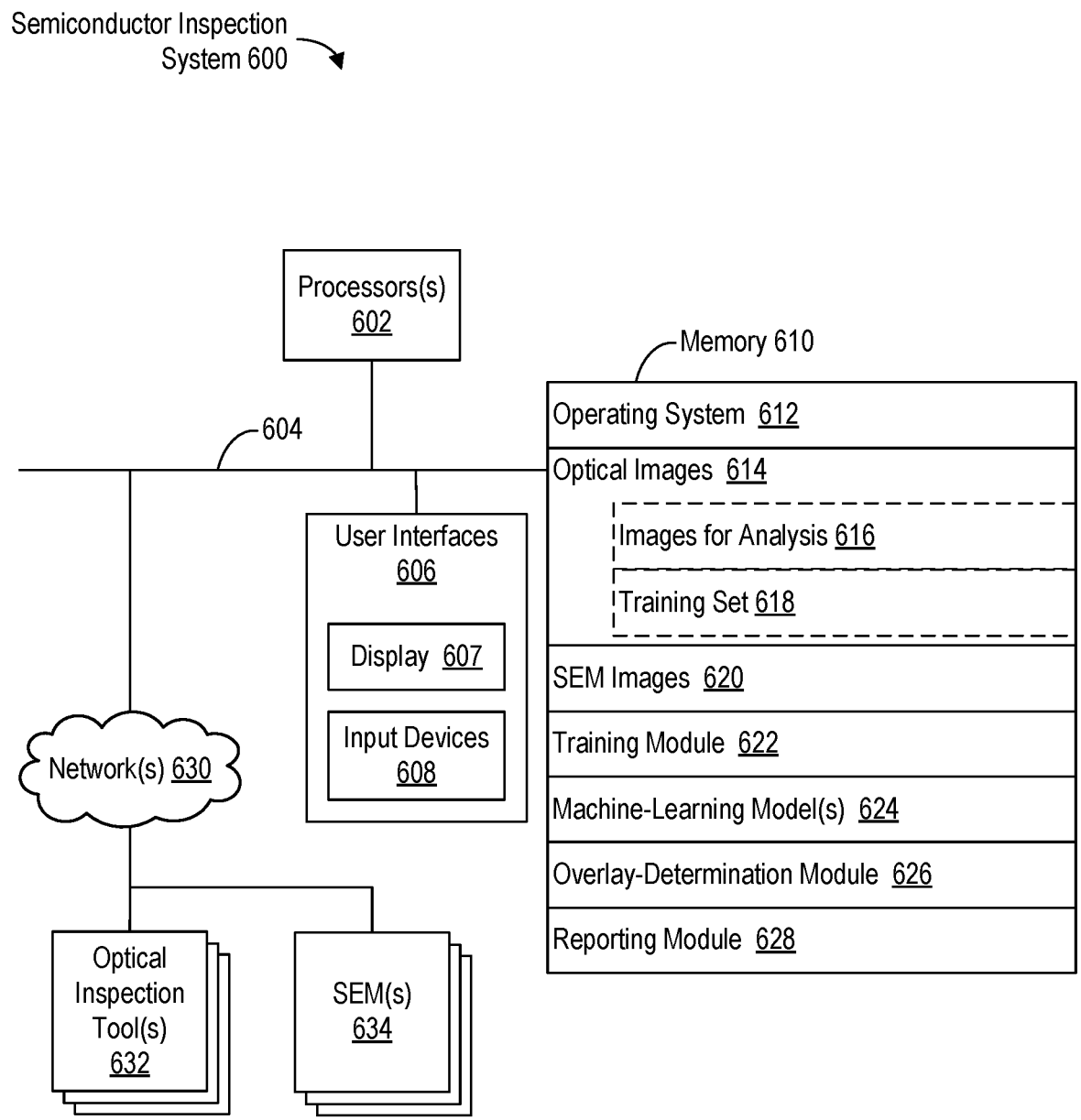
FIG. 6 is a block diagram of a semiconductor inspection system in accordance with some embodiments.

A plurality of sets of one or more optical images of portions of semiconductor wafers is obtained (404) from multiple optical inspection tools (e.g., optical inspection tools 632, FIG. 6). Each set shows the first structure and the second structure (e.g., shows a respective instance of the first and second structures at a particular location in a particular semiconductor die on a particular semiconductor wafer. Each set is generated by a respective optical inspection tool of the multiple optical inspection tools. The one or more optical images are different from the training set of optical images. For example, none of the one or more optical images were included in the training set. The respective instances of the first and second structures for the plurality of sets thus may be different (e.g., may be at different locations, on different semiconductor die, and/or on different semiconductor wafers) from each other and from the instances of the first and second structures in respective optical images of the training set. The multiple inspection tools may be the same as, or a subset or superset of, the plurality of inspection tools from which the training set was obtained. The one or more optical images of the method 300 (FIG. 3) may be a respective set of the plurality of sets.

In some embodiments, obtaining the one or more optical images includes optically inspecting (406) the portions of the semiconductor wafers using the multiple optical inspection tools. For example, if the multiple inspection tools include two tools, portions of some of the semiconductor wafers are inspected using the first tool to obtain some of the sets and portions of the remaining semiconductor wafers are inspected using the second tool to obtain the remaining sets. If the multiple inspection tools include three or more tools, portions of some of the semiconductor wafers are inspected using the first tool to obtain some of the sets, portions of other semiconductor wafers are inspected using the second tool to obtain other sets, portions of still other semiconductor wafers are inspected using the third tool obtain still other sets, and so on.

The plurality of sets is provided (414) to the machine-learning model (e.g., a neural-network model, gradient-boosting model, support vector machine, or principal-component-regression model). For example, the sets are successively provided to the machine-learning model, with each set being provided to the machine-learning model in turn, or when the set becomes available. Each set may be provided to the machine-learning model directly or indirectly, as described for step 314 of the method 300 (FIG. 3).

For each set of the plurality of sets, a respective estimated overlay offset between the first structure and the second structure (e.g., for the respective instance of the first and second structures) is obtained (418) from the machine-learning model: the machine-learning model is used to calculate the respective estimated overlay offset. The respective estimated overlay offset may be an estimated total overlay offset (e.g., total overlay offset 118, FIG. 1) or an estimated unintended overlay offset (e.g., unintended overlay offset 116). The machine-learning model determines the respective estimated overlay offset using the one or more optical images of the set and provides the estimated overlay offset as output. The respective estimated overlay offset may be received from the machine-learning model in response to providing the set to the machine-learning model. The machine-learning model may determine the estimated overlay offset based only on the one or more optical images of the set, or based on the one or more optical images of the set and based further on additional data (e.g., metadata for the set and/or additional metrology data for the instance of the first and second structures corresponding to the set).

In some embodiments, providing (414) the plurality of sets to the machine-learning model includes specifying (416) to the machine-learning model the respective optical inspection tools from which respective sets were obtained (e.g., from which each set of the plurality of sets was obtained). The machine-learning model thus knows which optical inspection tool generated which set, and may use this information along with the sets themselves to calculate the estimated overlay offsets. For example, a first set of one or more optical images is obtained from a first optical inspection tool of the multiple optical inspection tools. The first set is provided to the machine-learning model, as is (e.g., along with) a specification that the first set is from the first optical inspection tool. The machine-learning model calculates the respective estimated overlay offset for the first set based on the first set and based further on the first set being from the first optical inspection tool.

Alternatively, information about the optical inspection tools the sets were obtained from is not provided to the machine-learning model, which calculates the estimated overlay offsets without knowing this information.

In some embodiments, each set is (408) a single optical image showing the first structure and the second structure. Each set is provided to the machine-learning model, which calculates the estimated overlay offset for each set based on the single optical image, as described for steps 316 and 324 of the method 300 (FIG. 3).

In some other embodiments, each set includes (410) a first optical image focused on the first process layer and a second optical image focused on the second process layer. Each set is provided to the machine-learning model, which calculates the estimated overlay offset for each set based on the first and second optical images, as described for steps 318 and 326 of the method 300 (FIG. 3).

In some embodiments, each set includes (412) a plurality of optical images obtained by optically inspecting the portions of the semiconductor wafers using a plurality of respective optical modes. Each set is provided to the machine-learning model, which calculates the estimated overlay offset for each set based on the plurality of optical images, as described for steps 320 and 328 of the method 300 (FIG. 3).

The respective estimated overlay offsets obtained in the method 400 may be used directly for monitoring and controlling a semiconductor fabrication process (e.g., for statistical process control). Alternatively, a respective estimated overlay offset may be one of multiple inputs subsequently used to determine a respective overlay offset between a particular instance of the first and second structures. For example, the respective estimated overlay offset may be averaged or otherwise combined with one or more other respective overlay-offset values calculated for the instance of the first and second structures using different techniques (e.g., techniques not involving machine learning).

Figure 5:
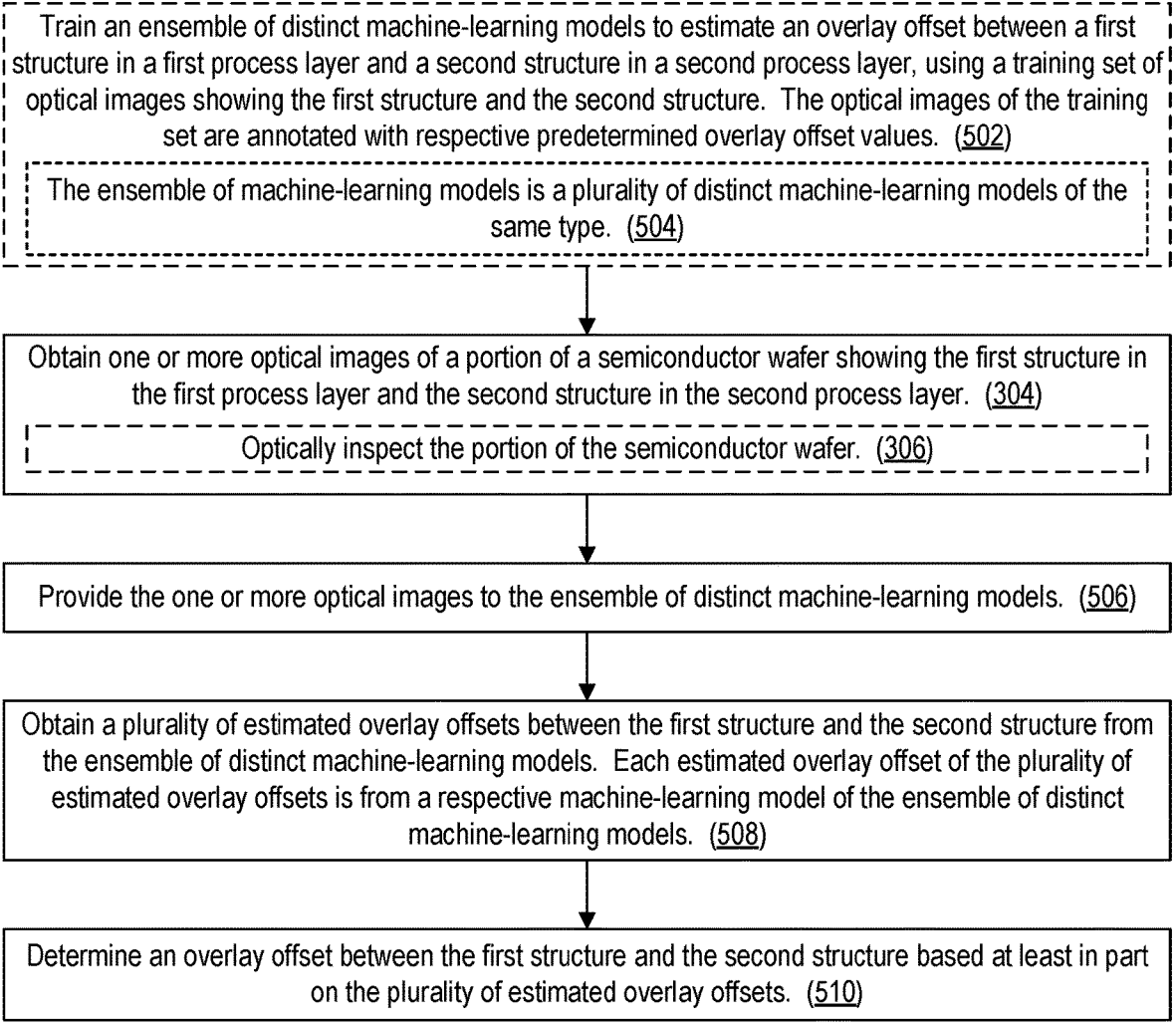
FIG. 5 is a flowchart showing a method of measuring an overlay offset using an ensemble of machine-learning models, in accordance with some embodiments.

FIG. 5 is a flowchart showing a method of measuring an overlay offset using an ensemble (i.e., a plurality) of machine-learning models, in accordance with some embodiments. The method 500 may be performed by one or more computer systems (e.g., the computer system of the semiconductor inspection system 600, FIG. 6). The method 500 may include the method 300 (FIG. 3), which may be performed as part of performing the method 500.

In some embodiments, an ensemble of distinct machine-learning models is trained (502) to estimate an overlay offset between a first structure in a first process layer (e.g., the first structure of the method 300, FIG. 3) and a second structure in a second process layer (e.g., the second structure of the method 300, FIG. 3), using a training set of optical images showing the first structure and the second structure. The optical images of the training set are annotated with respective predetermined overlay offset values (e.g., as measured using scanning electron microscopy). Each machine-learning model in the ensemble may be trained as described for step 302 of the method 300 (FIG. 3) and/or step 402 of the method 400 (FIG. 4).

The ensemble of machine-learning models may be (504) a plurality of distinct machine-learning models of the same type. For example, the machine-learning models may all be neural-network models, gradient-boosting models, support vector machines, or principal-component-regression models, the type thus being selected from the group consisting of neural-network models, gradient-boosting models, support vector machines, and principal-component-regression models. The training of each machine-learning model in the ensemble may involve randomization (e.g., randomized initialization). This randomization may result in each machine-learning model in the ensemble being distinct. Alternatively, different machine-learning models in the ensemble may be of different types.

Training the machine-learning model may alternatively be omitted from the method 500. For example, the method 500 is performed using an ensemble of machine-learning models (e.g., of the same type, such as neural-network models, gradient-boosting models, support vector machines, or principal-component-regression models) that have already been trained to estimate overlay offsets between the first structure and the second structure (e.g., the first and second structures of the method 300, FIG. 3) and have been deployed for use in semiconductor manufacturing.

One or more optical images of a portion of a semiconductor wafer are obtained (304) showing the first structure in the first process layer and the second structure in the second process layer, as described for the method 300 (FIG. 3). In some embodiments, obtaining the one or more optical images includes optically inspecting (306) the portion of the semiconductor wafer (e.g., using an optical inspection tool 632, FIG. 6).

The one or more optical images are provided (506) to the ensemble of distinct machine-learning models. The one or more optical images may be provided to each machine-learning model of the ensemble as described for step 314 of the method 300 (FIG. 3). For example, the one or more optical images may be provided to each machine-learning model of the ensemble as described for step 316 or step 318 of the method 300 (FIG. 3), and/or for step 320 of the method 300 (FIG. 3).

A plurality of estimated overlay offsets between the first structure and the second structure (e.g., for the particular instance of the first and second structures) is obtained (508) from the ensemble of distinct machine-learning models. Each estimated overlay offset of the plurality of estimated overlay offsets may be an estimated total overlay offset (e.g., total overlay offset 118, FIG. 1) or an estimated unintended overlay offset (e.g., unintended overlay offset 116). For example, all of the estimated overlay offsets of the plurality of estimated overlay offsets may be estimated total overlay offsets, or may be estimated unintended overlay offsets. Each estimated overlay offset of the plurality of estimated overlay offsets is from a respective machine-learning model of the ensemble of distinct machine-learning models. Each estimated overlay offset may be obtained as described for step 322 of the method 300 (FIG. 3). For example, each estimated overlay offset may be obtained as described for step 324 or step 326 of the method 300 (FIG. 3), and/or for step 328 of the method 300 (FIG. 3).

An overlay offset is determined (510) between the first structure and the second structure (e.g., for the particular instance of the first and second structures) based at least in part on the plurality of estimated overlay offsets. For example, the overlay offset is determined by averaging (e.g., calculating the mean of) the plurality of estimated overlay offsets or by otherwise combining the plurality of estimated overlay offsets. In some embodiments, the overlay offset is determined using the plurality of estimated overlay offsets and additional information. For example, the overlay offset is determined using the plurality of estimated overlay offsets and one or more additional overlay-offset values for the first and second structure determined without using the ensemble of machine-learning models. The determined overlay offset may be an estimated total overlay offset (e.g., total overlay offset 118, FIG. 1) or an estimated unintended overlay offset (e.g., unintended overlay offset 116).

Overlay offsets determined using the methods 300, 400, and/or 500 (FIGS. 3-5) may be used to measure process drift and thus to establish and maintain process control. For example, one or more process parameters (e.g., photolithographic exposure and/or dose) may be modified based at least in part on determined overlay offsets. Establishing and maintaining process control in this manner is especially important during the ramp-up period for a new semiconductor process and/or device, but is also important for maintaining yields during ongoing production.

FIG. 6 is a block diagram of a semiconductor inspection system 600 in accordance with some embodiments. The semiconductor inspection system 600 may be used for overlay metrology (e.g., for performing the methods 300, 400, and/or 500, FIGS. 3-5). The semiconductor inspection system 600 includes one or more (e.g., multiple) optical inspection tools 632, one or more SEMs 634, and a computer system with one or more processors 602 (e.g., CPUs and/or GPUs), user interfaces 606, memory 610, and communication bus(es) 604 interconnecting these components. In some embodiments, the optical inspection tools 632 and SEM(s) 634 are communicatively coupled to the computer system through one or more wired and/or wireless networks 630. The computer system may include one or more network interfaces for communicating with the optical inspection tools 632, SEM(s) 634, and other remote devices through the one or more networks 630.

The user interfaces 606 may include a display 607 and one or more input devices 608 (e.g., a keyboard, mouse, touch-sensitive surface of the display 607, etc.). The display 607 may display results, including overlay offsets.

Memory 610 includes volatile and/or non-volatile memory. Memory 610 (e.g., the non-volatile memory within memory 610) includes a non-transitory computer-readable storage medium. Memory 610 optionally includes one or more storage devices remotely located from the processors 602 and/or a non-transitory computer-readable storage medium that is removably inserted into the computer system of the semiconductor inspection system 600.

In some embodiments, memory 610 (e.g., the non-transitory computer-readable storage medium of memory 610) stores the following modules and data, or a subset or superset thereof: an operating system 612 that includes procedures for handling various basic system services and for performing hardware-dependent tasks, optical images 614 taken with the optical inspection tool(s) 632, SEM images 620 taken with the SEM(s) 634, a training module 622, one or more machine-learning models 624 (e.g., an ensemble of machine-learning models), an overlay-determination module 626, and a reporting module 628 to report results from the one or more machine-learning models 624 and/or the overlay-determination module 626.

The optical images 614 include images for analysis 616, which are to be provided to the one or more machine-learning models 624. The one or more machine-learning models 624 are executable to use the images for analysis 616 to determine estimated overlay offsets. The optical images 614 may also include a training set 618 to be provided to the training module 622 to train the one or more machine-learning models 624. The SEM images 620 include images of the same structures as the optical images in the training set 618. Overlay offsets for these structures are measured in the SEM images 620 and used to annotate the optical images in the training set 618, such that the overlay offsets measured in the SEM images 620 are provided to the training module 622 in association with respective optical images in the training set 618.

The overlay-determination module 626 is executable to determine overlay offsets based at least in part on estimated overlay offsets from the machine-learning model(s) 624. Overlay offsets determined by the overlay-determination module 626 may be provided to the reporting module 628. In some embodiments, the overlay-determination module 626 is omitted and estimated overlay offsets from the machine-learning model(s) 624 are provided to the reporting module 628.

The memory 610 (e.g., the non-transitory computer-readable storage medium of the memory 610) may include instructions for performing all or a portion of the methods 300, 400, and/or 500 (FIGS. 3-5). Each of the modules stored in the memory 610 (including the machine-learning model(s) 624) corresponds to a set of instructions, executable by the one or more processors 602, for performing one or more functions described herein. Separate modules need not be implemented as separate software programs. The modules and various subsets of the modules may be combined or otherwise re-arranged. In some embodiments, the memory 610 stores a subset or superset of the modules and/or data structures identified above.

FIG. 6 is intended more as a functional description of various features that may be present in a semiconductor inspection system than as a structural schematic. For example, the functionality of the computer system in the semiconductor inspection system 600 may be split between multiple devices. A portion of the modules stored in the memory 610 may instead be stored in one or more other computer systems communicatively coupled with the computer system of the semiconductor inspection system 600 through one or more networks. For example, the training module 622, training set 618, and SEM images 620 may be stored on a first computer system that trains the machine-learning model(s) 624. The machine-learning model(s) 624 may then be deployed to a second computer system that stores the machine-learning model(s) 624 along with the images for analysis 616, overlay-determination module 626, and/or reporting module 628.

The foregoing description, for purpose of explanation, has been described with reference to specific embodiments. However, the illustrative discussions above are not intended to be exhaustive or to limit the scope of the claims to the precise forms disclosed. Many modifications and variations are possible in view of the above teachings. The embodiments were chosen in order to best explain the principles underlying the claims and their practical applications, to thereby enable others skilled in the art to best use the embodiments with various modifications as are suited to the particular uses contemplated.

What is claimed is:

1. A method, comprising:
obtaining one or more optical images of a portion of a semiconductor wafer showing a first structure in a first process layer, a second structure in a second process layer, and a third structure in a third process layer;

providing the one or more optical images to a first machine-learning model trained to estimate an overlay offset between the first structure and the second structure and to a second machine-learning model trained to estimate an overlay offset between the second structure and the third structure;

obtaining an estimated overlay offset between the first structure and the second structure from the first machine-learning model; and obtaining an estimated overlay offset between the second structure and the third structure from the second machine-learning model.

2. The method of claim 1, wherein:

obtaining the one or more optical images comprises obtaining a single optical image showing the first structure in the first process layer and the second structure in the second process layer;

providing the one or more optical images to the first machine-learning model comprises providing the single optical image to the first machine-learning model; and obtaining the estimated overlay offset between the first structure and the second structure comprises using the first machine-learning model to calculate the estimated overlay offset between the first structure and the second structure based on the single optical image.

3. The method of claim 1, wherein:

obtaining the one or more optical images comprises obtaining a first optical image focused on the first process layer and a second optical image focused on the second process layer;

providing the one or more optical images to the first machine-learning model comprises providing the first optical image and the second optical image to the first machine-learning model; and obtaining the estimated overlay offset between the first structure and the second structure comprises using the first machine-learning model to calculate the estimated overlay offset between the first structure and the second structure based on the first optical image and the second optical image.

4. The method of claim 1, further comprising, before providing the one or more optical images to the first and second machine-learning models, training the first and second machine-learning models using a training set of optical images, wherein:

the training set of optical images is different from the one or more optical images;

the optical images of the training set are annotated with respective predetermined overlay offset values; and the respective predetermined overlay offset values for the optical images of the training set are measured using scanning electron microscopy.

5. The method of claim 1, wherein obtaining the one or more optical images comprises optically inspecting the portion of the semiconductor wafer.

6. The method of claim 5, wherein:

the one or more optical images comprise a plurality of optical images;

obtaining the plurality of optical images comprises optically inspecting the portion of the semiconductor wafer using a plurality of optical modes;

each optical mode of the plurality of optical modes has a distinct set of optical conditions for inspecting the portion of the semiconductor wafer; and each optical image of the plurality of optical images is obtained using a respective optical mode of the plurality of optical modes.

7. The method of claim 6, further comprising determining an overlay offset between the first structure and the second structure based at least in part on the plurality of estimated overlay offsets.

8. The method of claim 6, wherein the ensemble of machine-learning models is a plurality of distinct machine-learning models of the same type.

9. The method of claim 8, wherein the type is selected from the group consisting of neural-network models, gradient-boosting models, support vector machines, and principal-component-regression models.

10. A method, comprising:

obtaining a plurality of sets of one or more optical images of portions of semiconductor wafers from multiple optical inspection tools, wherein:

each set of the plurality of sets shows a first structure in a first process layer and a second structure in a second process layer, and each set of the plurality of sets is generated by a respective optical inspection tool of the multiple optical inspection tools;

providing the plurality of sets to a machine-learning model trained to estimate an overlay offset between the first structure and the second structure; and obtaining a respective estimated overlay offset between the first structure and the second structure for each set of the plurality of sets from the machine-learning model, comprising using the machine-learning model to calculate the respective estimated overlay offset.

11. The method of claim 10, wherein:

the plurality of sets comprises a first set of one or more optical images;

the first set of one or more optical images is obtained from a first optical inspection tool of the multiple optical inspection tools;

the method further comprises specifying to the machine-learning model that the first set is from the first optical inspection tool; and obtaining the respective estimated overlay offset between the first structure and the second structure for the first set comprises using the machine-learning model to calculate the respective estimated overlay offset based on the first set and based further on the first set being from the first optical inspection tool.

12. The method of claim 10, further comprising, before providing the plurality of sets to the machine-learning model, training the machine-learning model using a training set of optical images from the multiple inspection tools, wherein:

the training set of optical images is different from the plurality of sets of one or more optical images; and the optical images of the training set are annotated with respective predetermined overlay offset values.

13. The method of claim 12, wherein the respective predetermined overlay offset values for the optical images of the training set are measured using scanning electron microscopy.

14. A method, comprising:

obtaining a plurality of optical images of a portion of a semiconductor wafer showing a first structure in a first process layer and a second structure in a second process layer, comprising optically inspecting the portion of the semiconductor wafer using a plurality of optical modes, wherein:

each optical mode of the plurality of optical modes has a distinct set of optical conditions for inspecting the portion of the semiconductor wafer, and each optical image of the plurality of optical images is obtained using a respective optical mode of the plurality of optical modes;

providing the plurality of optical images to a machine-learning model trained to estimate an overlay offset between the first structure and the second structure; and obtaining an estimated overlay offset between the first structure and the second structure from the machine-learning model, comprising using the machine-learning model to calculate the estimated overlay offset based on the plurality of optical images.

15. A method, comprising:

obtaining a plurality of optical images of a portion of a semiconductor wafer showing a first structure in a first process layer and a second structure in a second process layer, comprising obtaining a first optical image focused on the first process layer and a second optical image focused on the second process layer;

providing the first optical image and the second optical image to a machine-learning model trained to estimate an overlay offset between the first structure and the second structure; and obtaining an estimated overlay offset between the first structure and the second structure from the machine-learning model, comprising using the machine-learning model to calculate the estimated overlay offset based on the first optical image and the second optical image.

16. A method, comprising:

obtaining one or more optical images of a portion of a semiconductor wafer showing a first structure in a first process layer and a second structure in a second process layer;

providing the one or more optical images to an ensemble of distinct machine-learning models trained to estimate an overlay offset between the first structure and the second structure; and obtaining a plurality of estimated overlay offsets between the first structure and the second structure from the ensemble of distinct machine-learning models, wherein each estimated overlay offset of the plurality of estimated overlay offsets is from a respective machine-learning model of the ensemble of distinct machine-learning models.

* * * * *